United States Patent [19]

Burns

[11] Patent Number: 5,011,789

[45] Date of Patent: Apr. 30, 1991

[54] METHOD OF MANUFACTURING A SEMICONDUCTOR DEVICE

[75] Inventor: Gordon P. Burns, Southampton, England

[73] Assignee: U.S. Philips Corporation, New York, N.Y.

[21] Appl. No.: 904,090

[22] Filed: Sep. 4, 1986

[30] Foreign Application Priority Data

Sep. 6, 1985 [GB] United Kingdom ............... 8522195
Dec. 6, 1985 [GB] United Kingdom ............... 8530053

[51] Int. Cl.$^5$ .................. H01L 21/20; H01L 21/324
[52] U.S. Cl. .............................. 437/81; 148/DIG. 25; 148/DIG. 17; 156/612; 437/82; 437/108; 437/946
[58] Field of Search ............... 29/576 E; 148/1.5, 75, 148/74, DIG. 25, 220, 71, 90, 93, 158; 156/610–615; 427/54, 55, 87; 437/81, 85, 82, 108, 109, 111, 173, 247, 939, 946

[56] References Cited

U.S. PATENT DOCUMENTS

| | | | |
|---|---|---|---|
| 4,115,163 | 9/1978 | Gorina et al. | 148/175 |
| 4,277,320 | 7/1981 | Beauwala et al. | 204/164 |
| 4,371,587 | 2/1983 | Peters | 428/446 |
| 4,435,445 | 3/1984 | Alfred et al. | 427/54.1 |
| 4,447,469 | 5/1984 | Peters | 427/54.1 |
| 4,544,423 | 10/1985 | Tsuge et al. | 148/174 |
| 4,579,609 | 4/1986 | Reif et al. | 148/175 |
| 4,585,671 | 4/1986 | Kitagawa et al. | 427/54.1 |
| 4,590,091 | 5/1986 | Rogers, Jr. et al. | 427/53.1 |
| 4,623,426 | 11/1986 | Peters | 156/614 |
| 4,640,004 | 2/1987 | Thomas et al. | 29/590 |

FOREIGN PATENT DOCUMENTS

1071412 2/1969 United Kingdom .

Primary Examiner—Olik Chaudhuri
Assistant Examiner—William Bunch
Attorney, Agent, or Firm—Paul R. Miller

[57] ABSTRACT

An epitaxial silicon layer may be deposited on a monocrystalline silicon body by Chemical Vapor Deposition at reduced pressure and low deposition temperature by a method which includes cleaning the substrate within the CVD reactor. The cleaning within the reactor is achieved solely by applying a heat pulse by heating the substrate to a cleaning temperature above 1000 degrees Celsius for a time in the range of from 15 seconds to 90 seconds. In one example deposition of the layer is started by introducing silicon carrier gas not more than 15 seconds before the end of the heat pulse and at the end of the heat pulse the substrate temperature is allowed to fall to a desired deposition temperature between 650 degrees Celsius and 800 degrees Celsius for silane and 800 degrees Celsius and 875 degrees Celsius for trichlorsilane. In another example the carrier gas is introduced before the start of the heat pulse and the deposition is terminated by allowing the substrate temperature to fall at the end of the heat pusle to a temperature below the minimum at which epitaxial deposition occurs. Preferably radiant heating is used to heat the substrate to the cleaning temperature, and the method may be carried out in an existing radiantly heated CVD reactor. The method allows the deposition of layers of low transition depth (D) shown by SIMS profile (3) of the layer (S-I) and doped substrate.

17 Claims, 4 Drawing Sheets

METHOD OF MANUFACTURING A SEMICONDUCTOR DEVICE

This invention relates to a method of manufacturing a semiconductor device in which an epitaxial layer is deposited on a surface of a monocrystalline silicon body.

A method of manufacturing a semiconductor device has been proposed in which an epitaxial layer is deposited on a surface of a monocrystalline silicon body, which method comprises passing a stream of hydrogen gas over the silicon body, applying a heat pulse to heat the silicon body to a temperature above 1000 degrees Celsius and passing a silicon carrier gas over the silicon body while the silicon body is at a temperature above 1000 degrees Celsius to cause silicon to be deposited on the silicon body.

British Patent Application No. GB-A-1071412 describes such a method. In the arrangement described in GB-A-1071412 a silicon body is heated in a reaction chamber to a temperature of 1000 degrees Celsius and hydrogen is then passed over the body for a period of thirteen minutes with the body maintained at the temperature of 1000 degrees Celsius. After purging of a mixing chamber, the temperature of the body is raised to 1200 degrees Celsius and hydrogen from the supply mixed in the mixing chamber with silicon tetrachloride is passed over the body. The body is maintained at 1200 degrees Celsius for a period of one minute during which silicon produced by reduction of the siilcon tetrachloride by the hydrogen is deposited on the body. The temperature of the silicon body is then reduced to 950 degrees Celsius and deposition continued for a further fifteen minutes.

The method described in GB-A-1071412 requires the precleaning of the silicon body in hydrogen at a temperature of 1000 degrees Celsius for thirteen minutes. The silicon body is thus subjected to a high temperature for a relatively long period of time during which problems such as diffusion and/or outgassing may occur in the silicon body.

It is an object of the present invention to overcome or at least mitigate the above mentioned problems.

According to one aspect of the present invention, there is provided a method of manufacturing a semiconductor device in which an epitaxial layer is deposited on a surface of a monocrystalline silicon body, which method comprises passing a stream of hydrogen gas over the silicon body, applying a heat pulse to heat the silicon body to a temperature above 1000 degrees Celsius and passing a silicon carrier gas over the silicon body while the silicon body is at a temperature above 1000 degrees Celsius to cause silicon to be deposited on the silicon body, characterised in that the stream of hydrogen is passed over the silicon body while the silicon body is at a temperature below 900 degrees Celsius and in that the heat pulse is applied to heat the silicon body from a temperature below 900 degrees Celsius to a temperature above 1000 degrees Celsius with the heat pulse causing the silicon body to be maintained at a temperature above 1000 degrees Celsius for a time in the range of from 15 to 120 seconds so that the surface of the silicon body is covered by silicon deposited while the silicon body is at a temperature above 1000 degrees Celsius.

The term 'heat pulse' as used herein, should be understood to mean a relatively short duration application of heat, normally for no more than two minutes, to raise the temperature of the substrate as required.

Thus, in a method embodying the invention, hydrogen is passed over the silicon body at a temperature below 900 degrees Celsius, that is at a temperature below which cleaning of the surface of the silicon body would normally occur so that diffusion and/or outgassing during the hydrogen purging are at least substantially mitigated. The temperature of the silicon body is then raised to a temperature above 1000 degrees Celsius for a period of from approximately 15 to approximately 120 seconds during which time cleaning of the substrate within the reaction chamber takes place and deposition of silicon is at least commenced. Thus, the inventor has found that, surprisingly, cleaning can be carried out during the application of the relatively short period heat pulse without the need for a relatively long period, ten minutes or more, cleaning in hydrogen at a temperature of 1000 degrees Celsius as required in the arrangement described in GB-A-1071412 enabling the chances of problems such as outgassing and/or diffusion occurring in the silicon body to be reduced.

The silicon body may be heated to the temperature above 1000 degrees Celsius which is preferably in the range of from 1000 degrees Celsius to 1250 degrees Celsius by a radiant heat source. Thus the cleaning of the substrate within the reaction chamber may be accomplished solely by the application of the heat pulse using the radiant heating source.

A method embodying the invention is carried out in a reaction chamber and the silicon body may be cleaned before being placed in the reaction chamber using a cleaning process such as that described in the RCA review 31,187 (1970) so that the silicon body when placed in the reaction chamber has established thereon a thin surface oxide layer which is substantially free from contaminant species, in particular carbon and metals. The surface oxide layer reduces risk of surface contamination while the substrate is being placed in the reaction chamber. As the temperature of the silicon body or substrate rises at the beginning of the heat pulse, amorphous and then polycrystalline silicon may be deposited, but these and the oxide layer are removed when the substrate temperature becomes sufficiently high to cause sublimation of the oxide from the surface, disrupting any amorphous or polycrystalline deposition present. The increasing temperature of the substrate may promote a reaction between any deposited amorphous or polycrystalline silicon and silicon dioxide present on the substrate surface, leading to the formation of silicon monoxide which sublimes at about 1000 degrees Celsius. Thus the step of cleaning the silicon body or substrate within the reaction chamber is effected during the step of applying the heat pulse and may be effected during the part of the heat pulse in which the substrate temperature is raised to a temperature above 1000 degrees Celsius, but, for example, below 1250 degrees Celsius. As soon as the substrate surface is sufficiently clean deposition of the epitaxial layer proceeds while the temperature of the silicon body is maintained above 1000 degrees Celsius.

The passing of the silicon carrier gas over the silicon body or substrate may be commenced after or before the start of the heat pulse. In the latter case, the silicon carrier gas stream may thus be introduced into the reaction chamber under reaction chamber conditions in which the decomposition of the gas does not occur. The gas stream can therefore be established and stabilised so that deposition is effected under the required gas stream conditions. This prevents there being any deposition during gas stream conditions which are not those required for the required deposition.

In one embodiment, deposition may be effected only during the heat pulse. Thus, the temperature of the silicon body may be allowed to fall immediately, for example within ten seconds, after the termination of the heat pulse to a temperature below that at which deposition can occur. Such a rapid temperature fall ensures that there is an abrupt cut off to the deposition step as the rate of deposition falls by a factor of approximately ten for each 100 degrees Celsius fall in the temperature of the silicon body. The deposition of the majority of the layer may therefore be effected with the substrate at the temperature between 1000 degrees Celsius and 1250 degrees Celsius, with the advantage that rapid deposition occurs at such a temperature. In such a case, the beginning and end of the epitaxial deposition may be monitored by measuring the substrate temperature. The silicon carrier gas may be either silane or trichlorsilane with which gases the minimum temperature at which epitaxial deposition occurs is approximately either 500 degrees Celsius or 750 degrees Celsius respectively.

It may be advantageous where deposition is only being effected during the heat pulse to effect epitaxial deposition from silane for layers of, for example, 1 micrometer or more thickness because it has a greater deposition rate than trichlorsilane at a temperature between 1000 degrees Celsius and 1250 degrees Celsius, thus minimising the time the substrate is maintained at this temperature. Conversely it may be advantageous to effect epitaxial deposition from trichlorsilane for layers of less than, for example, 1 micrometer thickness as it has a lower deposition rate and a higher minimum epitaxial deposition temperature than silane allowing more accurate control of epitaxial layer thickness.

Alternatively, deposition may be continued after the termination of the heat pulse by allowing the temperature of the silicon body to fall to a desired deposition temperature after termination of the heat pulse. The silicon carrier gas may be silane and the desired deposition temperature at which the remainder of the epitaxial layer may be deposited may be a temperature in the range of from 650 degrees Celsius to 800 degrees Celsius, allowing the deposition of epitaxial layers on a substrate by the decomposition of silane at a temperature as low as 650 degrees Celsius without the need for plasma cleaning of the substrate surface and without any other cleaning of the substrate within the reaction chamber, apart from the application of the single heat pulse. Alternatively, the silicon carrier gas may be trichlorsilane and the desired deposition temperature at which the remainder of the epitaxial layer may be deposited may be a temperature in the range of from 800 degrees Celsius to 875 degrees Celsius, allowing deposition of epitaxial layers on a substrate by the decomposition of trichlorsilane at a temperature as low as 800 degrees Celsius. The presence of chlorine and hydrogen chloride gas in the reaction chamber after decomposition of trichlorsilane assists the retention of a clean surface on which the epitaxial deposition progresses.

The facility to carry out relatively long period chemical vapour deposition of epitaxial silicon layers on monocrystalline silicon bodies or substrates at temperatures in the range between 650 degrees Celsius and 800 degrees Celsius is of considerable importance in the manufacture of silicon devices, particularly integrated circuits, because deposition at these lower temperatures greatly reduces the transfer of dopant from the substrate to the layers (known as invasion) and also greatly reduces the diffusion of dopants within the substrate. It is also important that thin layers of accurately controlled thickness may be deposited in an established manufacturing environment without recourse to more complex deposition techniques for the deposition of such thin layers, such as molecular beam epitaxy. That such depositions may be made with chemical vapour deposition equipment which is already widely used in the silicon device and integrated circuit manufacturing environment is a considerable benefit.

At the beginning of the step of applying the heat pulse the temperature of the substrate may be raised to a temperature above 1000 degrees Celsius in less than about 20 seconds. A method in accordance with the invention thus only requires the silicon body to be maintained at the temperature above 1000 degrees Celsius during the step of applying the heat pulse, as during this heat pulse both the step of cleaning the substrate or silicon body and the step of at least initial deposition are effected. The rapid rates of silicon body temperature changes ensure that the substrate is at this high temperature for a length of time which is substantially equal to the time required to effect the at least initial epitaxial deposition covering the surface of the silicon body. The epitaxial layer may thus be deposited at the advantageously high rate offered by deposition at high temperature, but the deleterious effect of the high temperature on the silicon body and layer is minimised by maintaining the silicon body at that temperature only during the heat pulse.

The substrate within the reaction chamber may be at ambient-temperature prior to the application of the heat pulse. However, it may be desirable to preheat the substrate to an elevated temperature prior to the application of the heat pulse to reduce the heating power required to apply the heat pulse. The elevated temperature to which the substrate may be raised is not critical but will be below the minimum temperature at which cleaning occurs.

Where the silicon carrier gas is introduced after the start of the heat pulse, the elevated temperature may be the desired deposition temperature for the epitaxial silicon layer. However, where the silicon carrier gas is introduced prior to the heat pulse, it may be desirable for the elevated temperature to be below the minimum deposition temperature to enable establishment and stabilisation of the carrier gas stream as discussed above. The heating to an elevated temperature may be accomplished by the same radiant heat source as may be used to heat the silicon body to the cleaning temperature. The preheating may be used to advantage to adjust the heating power to ensure a stable deposition temperature where deposition is to continue after the heat pulse. Where the preheating is by radiant heating of the silicon body the cleaning temperature may be achieved by increasing the radiant heating power. In the manufacture of silicon devices there is the advantage of faster throughput to be gained from the shorter substrate cleaning time and a cost advantage to be gained if the cleaning step in accordance with the invention may be carried out in an existing radiantly heated reaction chamber.

Figure 1:
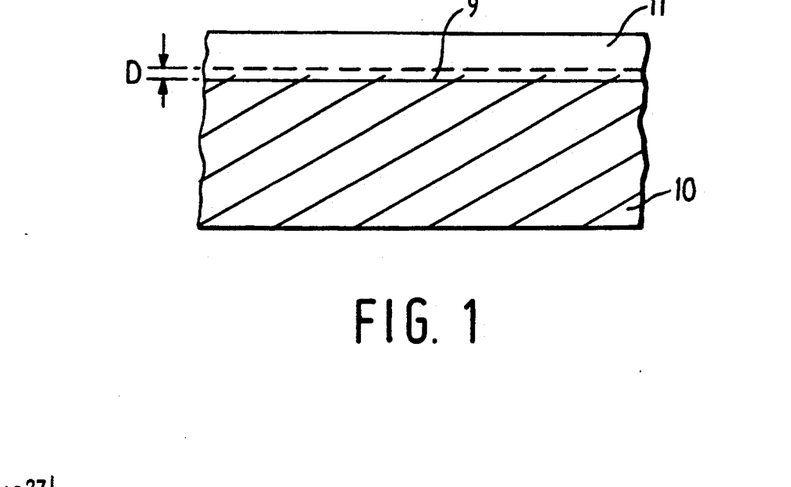
FIG. 1 shows schematically in cross section an epitaxial silicon layer on a surface of a monocrystalline silicon substrate.

Referring now to the drawings, FIG. 1 shows a part 10 of a monocrystalline silicon substrate on a surface 9 of which an epitaxial silicon layer 11 is grown by a method in accordance with the invention. The method in accordance with the invention allows growth of the epitaxial layer to be made in a manner in which the resulting invasion of any dopant species present in the substrate 10 into the layer 11 is minimised. The extent of invasion is characterised by a transition depth D, which is defined as the depth of expitaxial layer required for the invading dopant species concentration to decay to a value two orders of magnitude below the concentration of dopant species in the substrate or from $10^{25} m^{-3}$ to $10^{23} m^{-3}$ if the concentration of dopant species in the substrate is greater than $10^{25} m^{-3}$.

EXAMPLE 1

An example of a method in accordance with a first embodiment of the invention will now be described.

A 0.05m diameter arsenic doped monocrystalline silicon body or substrate with an arsenic concentration of $2.4 \times 10^{25}$ As $m^{-3}$ was chemically cleaned using a process as described in the RCA Review 31,187 (1970) then placed on a support in a chemical vapour deposition reaction chamber. The support was a body of silicon carbide coated graphite which had previously been coated with polysilicon. The reaction chamber was then purged with nitrogen and the pressure in the chamber was reduced to the base pressure of 0.25 Pa. After backfilling and purging the reaction chamber with hydrogen, the substrate was heated by radiant heaters to an elevated temperature of 750 degrees Celsius the desired deposition temperature for the epitaxial silicon layer. With the hydrogen pressure in the reaction chamber at 6 Pa the substrate surface was cleaned by a heat pulse by radiantly heating the substrate to 1050 degrees Celsius for a period of 50 seconds.

It should of course be appreciated that the substrate need not necessarily be raised to an elevated temperature prior to the application of the heat pulse but that savings in the power required to apply the heat pulse can be made if the substrate is first raised to such an elevated temperature. The elevated temperature to which the substrate may be raised before application of the heat pulse is not critical but will be below that required to initiate cleaning.

After 40 seconds of the heat pulse cleaning of the substrate surface the hydrogen was turned off and simultaneously a stream of silane at a pressure of 6 Pa was introduced into the reaction chamber to commence deposition of the epitaxial layer. Thus the silane was present for a period of 10 seconds up to the end of the heat pulse. At the end of the heat pulse the substrate temperature was allowed to fall to the desired deposition temperature of 750 degrees Celsius and the deposition of the epitaxial silicon layer proceeded for 30 minutes from the introduction of the silane. The silicon layer was thus deposited in three consecutive periods, the first for 10 seconds at the cleaning temperature of 1050 degrees Celsius, the second for approximately 200 seconds while the substrate temperature fell from 1050 degrees Celsius to 750 degrees Celsius and the third for approximately a further 26 minutes 30 seconds at the desired deposition temperature of 750 degrees Celsius while the remainder of the layer was deposited. The thickness of the epitaxial layer was found to be 0.87 micrometers, deposited at an average rate of 1.74 micrometers per hour. Comparative experiments using identically prepared substrates with the same deposition technique, except that the time at the desired deposition temperature was different from that in Example 1, showed that the rate of deposition at the desired deposition temperature of 750 degrees Celsius was approximately 1.2 micrometers per hour. Thus in the layer deposited as described in Example 1 about 0.27 micrometers were deposited during the first and second temperature periods, and the remainder of the layer of about 0.6 micrometers was deposited during the third temperature period at the desired deposition temperature.

Figure 2:
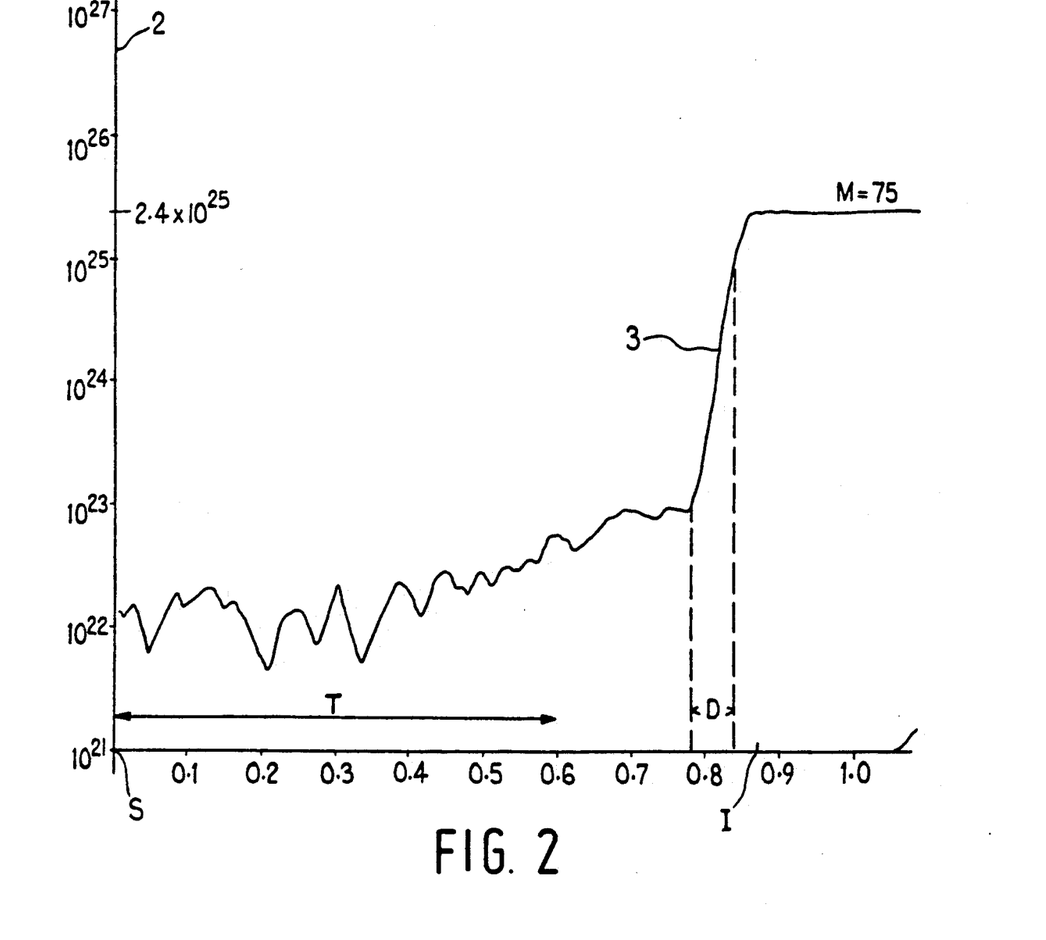
FIG. 2 is a secondary ion mass spectroscopy depth profile of part of a silicon substrate and an epitaxial silicon layer deposited thereon by a method in accordance with a first embodiment of the invention.

An electron channelling pattern analysis of the layer showed it to be epitaxial with the substrate and a secondary ion mass spectroscopic (SIMS) depth profile of the epitaxial layer and underlying substrate was made to determine the arsenic dopant concentration profile across the epitaxial layer - substrate surface interface as shown in FIG. 2. The abscissa 1 of FIG. 2 represents depth from the surface of the epitaxial layer measured in micrometers, the ordinate 2 represents the concentration of arsenic atoms on a logarithmic scale in atoms per cubic meter. The position S on the abscissa represents the position of the surface of the epitaxial layer, I represents the position of the interface between the epitaxial layer and the substrate surface for the 0.87 micrometer thickness epitaxial layer and T the 0.6 micrometers remainder of the layer grown at the desired deposition temperature of 750 degrees Celsius. Curve 3 represents the arsenic concentration; and the isotope of arsenic used in the SIMS profile has an atomic weight M equal to 75. The transition depth D, between invading dopant concentrations of $10^{25} m^{-3}$ and $10^{23} m^{-3}$ in the epitaxial layer, is 0.05 micrometers. Thus a layer deposited by a method in accordance with the invention as described in Example 1 is epitaxial and exhibits a transition depth D of 5.7% of the measured thickness of the layer despite the deposition of this part of the layer during the first and second temperature periods at a higher temperature than the desired deposition temperature.

At present the rate of cooling from the cleaning temperature to the desired deposition temperature is limited by the thermal inertia of the reactor. It is postulated that a further reduction of the cooling time from the cleaning temperature to the desired deposition temperature would yield a corresponding reduction in the transition depth.

In order to demonstrate the efficacy of a method in accordance with the invention, an attempt was made to deposit an epitaxial layer on a similar silicon substrate, by using the method described in the Example 1 but which omitted the step of cleaning the substrate by the heat pulse. This resulted in there being no measurable deposition of epitaxial silicon.

Further experiments to deposit a silicon epitaxial layer by the decomposition of silane on a surface of a monocrystalline silicon substrate have been made by a method in accordance with the invention similar to the first embodiment in which deposition is continued after the end of the heat pulse at a desired deposition temperature. In these experiments various cleaning times of from 15 to 90 seconds were used, the period prior to the end of the heat pulse during which silane was introduced was varied up to 15 seconds and the desired deposition temperature was varied in the range of from 650 degrees Celsius to 800 degrees Celsius. In all the experiments electron channelling pattern analysis indicated that epitaxial layers had been deposited at substrate temperatures in the range of from 650 degrees Celsius to 800 degrees Celsius. The deposition rate at 650 degrees Celsius was found to be 0.15 micrometers per hour which may be too slow for some applications of the method, and the deposition rate was found to increase by approximately 10 times for each 100 degrees Celsius rise in temperature in the range of from 650 degrees Celsius to 800 degrees Celsius. Similar experiments using trichlorsilane showed that epitaxial layers were deposited at substrate temperatures in the range of from 800 degrees Celsius to 875 degrees Celsius.

No correlation was found between either the length of time of substrate cleaning between 15 and 90 seconds or the length of time the silicon carrier gas stream was present during the cleaning, or the desired deposition temperature, or the cleaning temperature. However, if the cleaning step within the reaction chamber by the heat pulse was omitted there was no deposition of an epitaxial silicon layer.

EXAMPLE 2

An example of a method in accordance with a second embodiment of the invention in which deposition is carried out substantially only during the heat pulse will now be described.

A 0.05m diameter arsenic doped monocrystalline silicon body or substrate with an arsenic concentration of $2.0 \times 10^{25}$ As $m^{-3}$ was chemically cleaned using a process as described in the RCA Review 31,187 (1970) then placed on a support in a chemical vapour deposition reaction chamber. The back and edges of the substrate were not coated in thermally grown oxide to reduce autodoping. The support was a body of silicon carbide coated graphite which had previously been coated with polysilicon. The reaction chamber was then purged with nitrogen and the pressure in the chamber was reduced to the base pressure of 0.25 Pa. After backfilling and purging the reaction chamber with hydrogen, the pressure in the reaction chamber was again reduced to the base pressure of 0.25 Pa and the substrate was heated by radiant heaters to 400 degrees Celsius. A stream of silane at a flow rate of 4 cm³/min was then introduced into the reaction chamber and the reaction chamber pressure was allowed to stabilise at 6 Pa.

Figure 3:
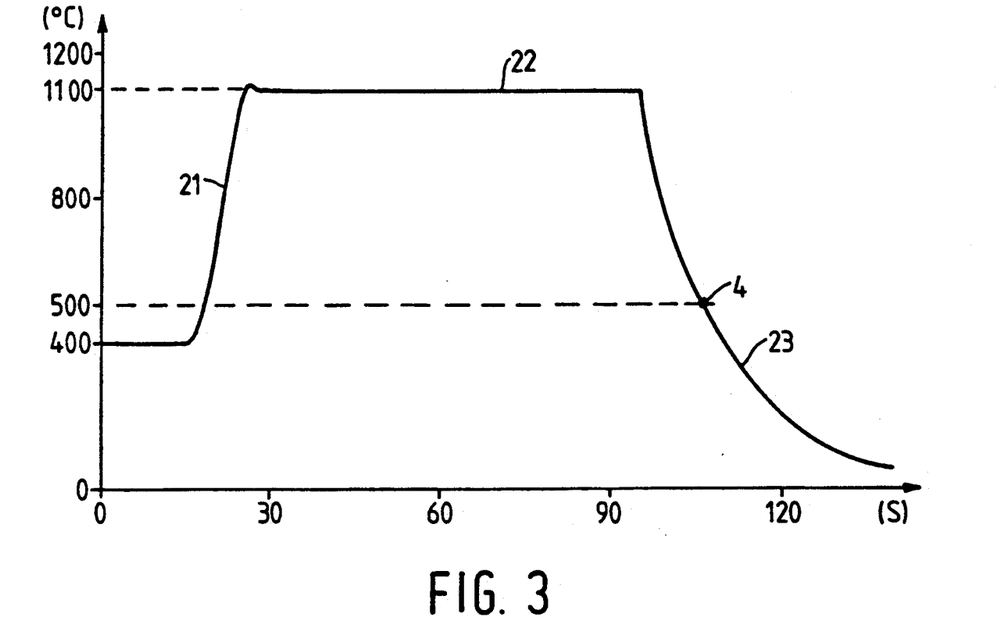
FIG. 3 shows schematically the substrate temperature (degrees Celsius) vs time (S) profile of the heat pulse used in a method in accordance with a second embodiment of the invention.

When the reaction chamber pressure had stabilised a heat pulse was applied to the silicon body or substrate; the substrate temperature vs. time profile of that heat pulse was as shown in FIG. 3. Thus, prior to the application of the heat pulse, the substrate temperature was raised to preheat the substrate to 400 degrees Celsius and was then raised by the application of the heat pulse from 400 degrees Celsius to 1100 degrees Celsius, 21, in 8.5 seconds, maintained at that temperature 22 for 70 seconds and then allowed to fall, 23, to ambient. The substrate temperature fell to a minimum temperature 4 approximately 500 degree Celsius), at which epitaxial deposition is effected from silane in 11 seconds.

The steps of cleaning the substrate and depositing the epitaxial layer are effected during the application of the heat pulse with the stream of silane present in the reaction chamber thus ensuring that deposition takes place on the clean substrate without having to store the cleaned substrate in the reaction chamber before deposition commences.

The layer deposited as described in Example 2 had a thickness of 0.76 micrometers deposited in a total heat pulse time of 92 seconds including 70 seconds at 1100 degrees Celsius.

Figure 4:
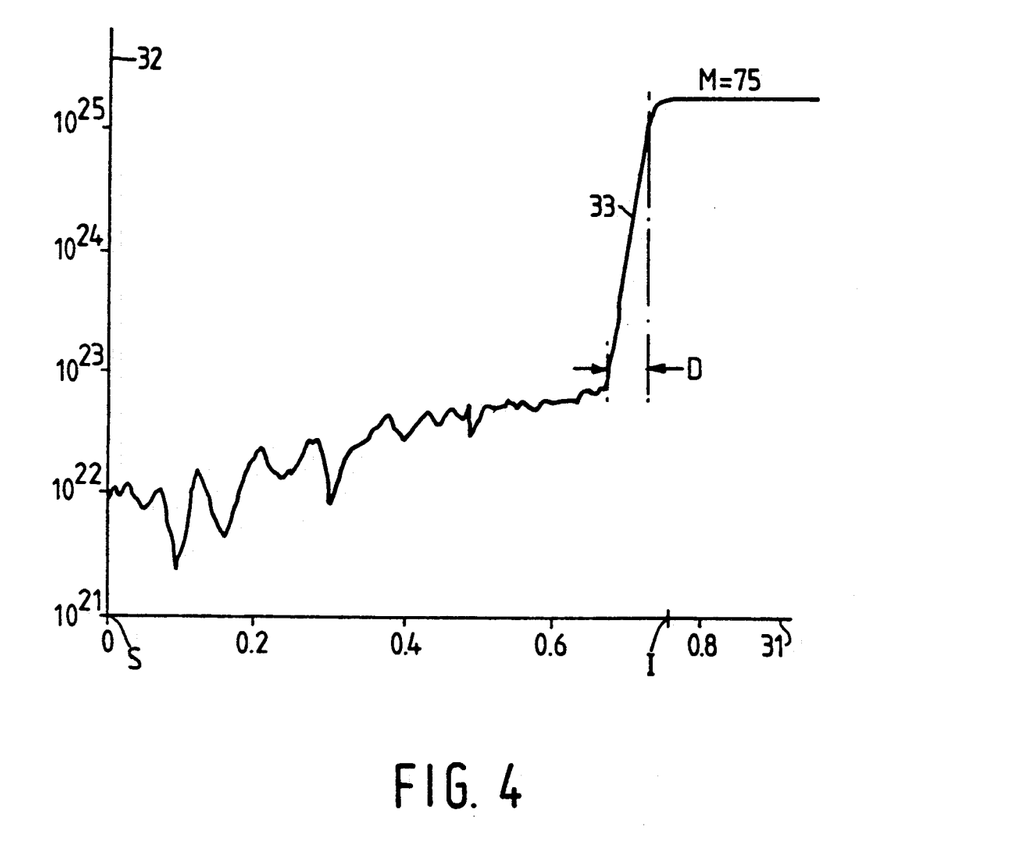
FIG. 4 is a secondary ion mass spectroscopy (SIMS) depth profile of part of a silicon substrate and an epitaxial layer deposited thereon by a method in accordance with the second embodiment of the invention.

An electron channelling pattern analysis of the layer deposited as described in Example 2 showed it to be epitaxial with the substrate and a secondary ion mass spectroscopic (SIMS) depth profile of the epitaxial layer and underlying substrate was made to determine the arsenic dopant concentration profile across the epitaxial layer - substrate surface interface as shown in FIG. 4. The abscissa 31 of FIG. 4 represents depth from the surface of the epitaxial layer measured in micrometers, and the ordinate 32 represents the concentration of arsenic atoms on a logarithmic scale in atoms per cubic meter. The position S on the abscissa represents the position of the surface of the epitaxial layer, I represents the position of the interface between the epitaxial layer and the substrate surface for the 0.76 micrometers thickness epitaxial layer. Curve 33 represents the arsenic concentration; and the isotope of arsenic used in the SIMS profile has an atomic weight M equal to 75. The transition depth D, between invading dopant concentrations of $10^{25} m^{-3}$ and $10^{23} m^{-3}$ in the epitaxial layer, is 55 nanometers. Thus a layer deposited by a method in accordance with the invention as described in this Example 2 is epitaxial, exhibits a transition depth D of 7.2% of the measured thickness of the layer and has a carbon and oxygen concentration in the deposited layer which is below the detection limit of between $10^{20}$ and $10^{21}$ $m^{-3}$ of the SIMS profile.

EXAMPLE 3

An example of a method in accordance with a third embodiment of the invention in which, as in the Example 2, deposition is stopped after the heat pulse is ended will now be described.

Figure 5:
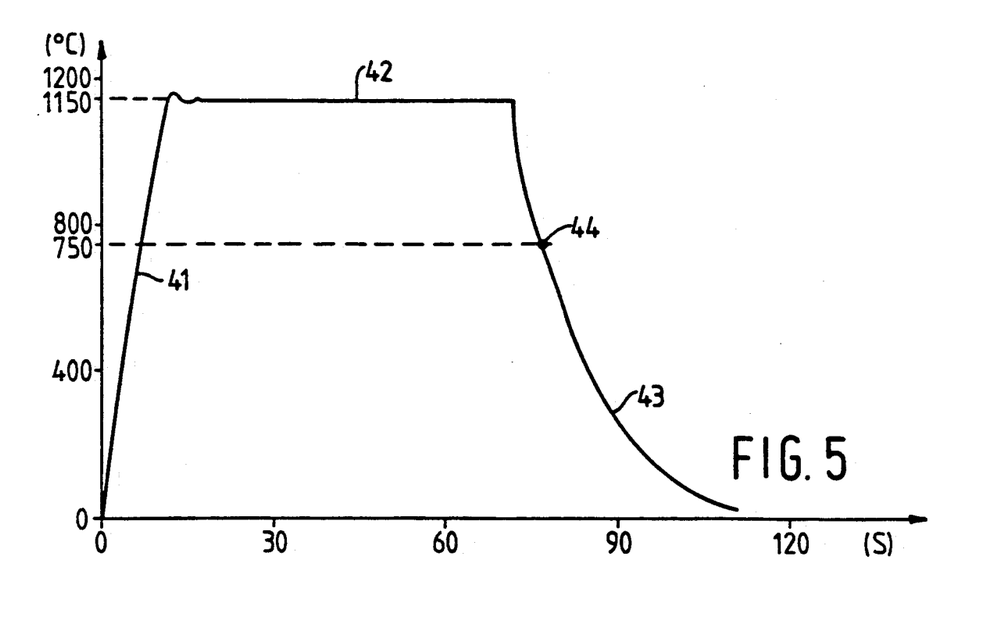
FIG. 5 shows schematically the substrate temperature (degrees Celsius) vs time (S) profile of the heat pulse used in a method in accordance with a third embodiment of the invention.

A 0.05m diameter arsenic doped monocrystalline silicon body or substrate with an arsenic concentration of $2.4 \times 10^{25}$ As $m^{-3}$ was chemically cleaned using a process as described in the RCA Review 31,187 (1970) then placed on a support in a chemical vapour deposition reaction chamber. The back and edges of the substrate were not coated with thermally grown oxide to reduce autodoping. The support was a body of silicon carbide coated graphite which had previously been coated with polysilicon. The reaction chamber was then purged with nitrogen and the pressure in the chamber was reduced to the base pressure of 0.25 Pa. After backfilling and purging the reaction chamber with hydrogen the pressure in the reaction chamber was reduced and a stream of trichlorsilane at a mass flow rate of 0.22gm/min was introduced into the reaction chamber and the reaction chamber pressure was allowed to stabilise at $7.6 \times 10^3$ Pa, whereupon a heat pulse was applied to the substrate by radiant heating. The substrate temperature vs time profile of that heat pulse is shown in FIG. 5. The substrate temperature was raised 41 from ambient to 1150 degrees Celsius in 12 seconds and maintained 42 at that temperature for 60 seconds, after which the substrate temperature was allowed to fall 43 to ambient. The substrate temperature fell to a minimum temperature 44 (approximately 750 degrees Celsius) at which epitaxial deposition can be effected from trichlorsilane in 5 seconds, after which the trichlorsilane stream was shut off. The time taken for the substrate temperature to fall below the minimum temperature for any deposition is such that substantially the entire thickness of the epitaxial layer is deposited while the substrate is maintained at 1150 degrees Celsius.

The steps of cleaning the substrate and depositing the layer are effected during the heat pulse in the stream of trichlorsilane in the reaction chamber. The decomposition products of trichlorsilane include hydrochloric acid gas which may assist in cleaning the substrate.

The layer deposited as described in Example 3 had a thickness of 0.43 μm, deposited in a total heat pulse time of 79.5 seconds, including 60 seconds at 1150 degrees Celsius.

Figure 6:
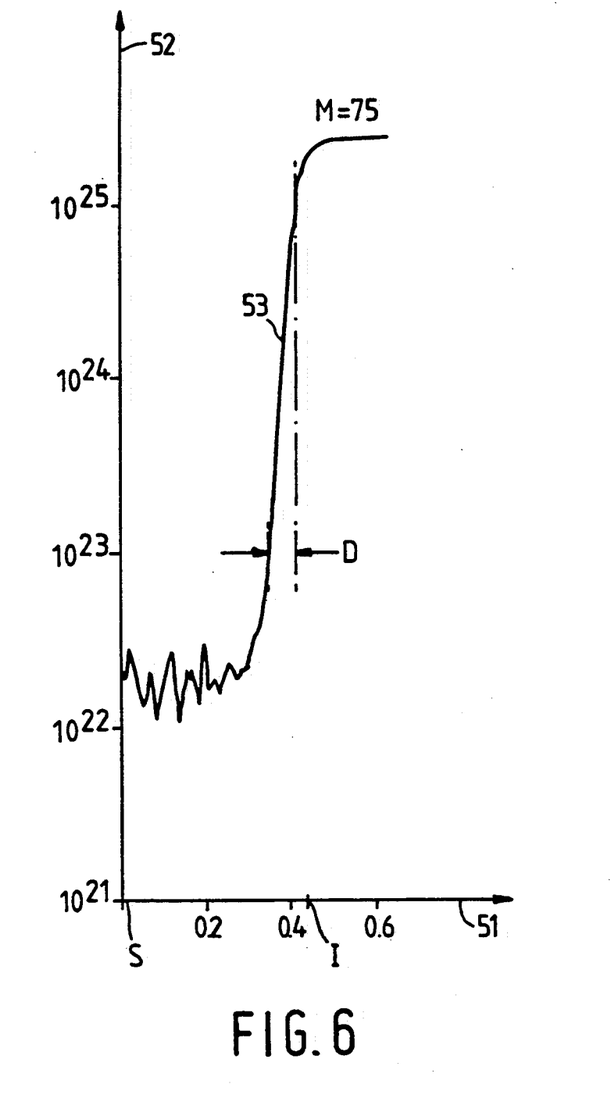
FIG. 6 is a SIMS depth profile of part of a silicon substrate and an epitaxial layer deposited thereon by a method in accordance with the third embodiment of the invention.

An electron channelling pattern analysis of the layer deposited as described in Example 3 showed it to be epitaxial with the substrate and a secondary ion mass spectroscopic (SIMS) depth profile of the epitaxial layer and underlying substrate was made to determine the arsenic dopant concentration profile across the epitaxial layer - substrate surface interface as shown in FIG. 6. The abscissa 51 of FIG. 6 represents depth from the surface of the epitaxial layer measured in micrometers, the ordinate 52 represents the concentration of arsenic atoms on a logarithmic scale in atoms per cubic meter. The position S on the abscissa represents the position of the surface of the epitaxial layer, and I represents the position of the interface between the epitaxial layer and the substrate surface for the 0.43 micrometer thickness epitaxial layer. Curve 53 represents the arsenic concentration; and the isotope of arsenic used in the SIMS profile has an atomic weight M equal to 75. The transition depth D, between invading dopant concentrations of $10^{25}$m$^{-3}$ and $10^{23}$m$^{-3}$ in the epitaxial layer, is 62 nanometers which compares favourably with the values reported in the prior art. Thus a layer deposited by a method in accordance with the invention as described in Example 3 is epitaxial, exhibits a transition depth D of 14% of the measured thickness of the layer and has a carbon and oxygen concentration in the deposited layer which is below the detection limit of between $10^{20}$ and $10^{21}$ m$^{-3}$ of the SIMS depth profile.

Further experiments to deposit a silicon epitaxial layer on a silicon body substantially only during the heat pulse by the decomposition of trichlorsilane on a surface of a monocrystalline silicon substrate have been made by a method in accordance with the invention. In these experiments layers having thicknesses as low as 0.23 micrometers were deposited under conditions identical to those of Example 3 with the exception that the length of time the substrate was maintained at 1150 degrees Celsius was varied in accordance with the thickness of the layer to be deposited. A 0.23 micrometer layer was deposited with the substrate maintained at 1150 degrees Celsius for 35 seconds. SIMS analysis of these layers indicated that the transition depth D between the substrate and the layer was dependent on the thickness of the layer and hence on the length of time the substrate was maintained at 1150 degrees Celsius. For the 0.23 micrometer layer, the transition depth, D, was found to be 30 nanometers.

Although the substrate in Example 2 was preheated to 400 degrees Celsius while the substrate in Example 3 was at ambient temperature prior to the application of the heat pulse, it should be appreciated that the temperature of the substrate prior to application of the heat pulse is not critical but will be below the minimum temperature at which cleaning occurs, and preferably below that at which epitaxial deposition occurs. The substrate will normally only be elevated in temperature prior to application of the heat pulse when the heating power available may not be sufficient to raise the temperature as rapidly as desired to apply the heat pulse. The minimum time of 15 seconds for the heat pulse of the cleaning step employed in these experiments was imposed by the power available for the radiant heaters and by the thermal inertia of the reaction chamber, not by any limit to the effectiveness of the cleaning step. Heat pulse duration times of less than 15 seconds, and a reduction in the time taken for the substrate temperature to fall from the heat pulse cleaning temperature after termination of the heat pulse may advantageously be employed in a method in accordance with the present invention and may be achieved with a radially heated reactor adapted from a radiantly heated rapid annealing furnace such as that described in GB Patent Application 2136937 (Philips Electronics and Associated Industries Ltd).

There are a number of known means by which the substrate may be heated, including induction heating, resistive heating and radiant heating. Radiant heating is to be preferred in that it can provide the most rapid heating for the substrate as it may be used to heat the substrate directly without the need for a susceptor as is required in induction heating, or a heater body as is required in resistive heating.

A method in accordance with the invention is not to be considered limited to the deposition of undoped epitaxial layers on doped substrates as shown in the Figures and described in the Examples. A method in accordance with the invention may be used for the deposition of doped epitaxial layers by the introduction into the reaction chamber of an appropriate dopant carrier gas.

I claim:

1. A method of manufacturing a semiconductor device comprising the steps of
    passing a stream of hydrogen gas over a silicon body, said silicon body being at a first temperature below 900 degrees Celsius to prevent at least one of diffusion and outgassing from said silicon body,
    applying a heat pulse to said silicon body to heat said silicon body form said first temperature to a second temperature above 1000 degrees Celsius, said heat pulse cleaning surfaces of said silicon body at said second temperature,
    maintaining said heat pulse at said second temperature for time ranging from 15 to 120 seconds,
    passing a silicon carrier gas over said silicon body during said heat pulse to deposit an epitaxial silicon layer on said silicon body at said second temperature, and
    reducing temperature below a minimum temperature for depositing silicon at the end of said heat pulse.

2. A method according to claim 1, wherein said step of passing said silicon carrier gas over said silicon body is commenced after application of said heat pulse.

3. A method according to claim 1, wherein said step of passing said silicon carrier gas over said silicon body is commenced before application of said heat pulse.

4. A method according to claim 1, wherein said silicon body falls from said second temperature above 1000 degrees Celsius to a temperature below said minimum temperature in less than approximately ten seconds.

5. A method according to claim 4, wherein said silicon carrier gas is silane and said minimum temperature is approximately 500 degrees Celsius.

6. A method according to claim 4, wherein said silicon carrier gas is trichlorsilane and said minimum temperature is approximately 750 degrees Celsius.

7. A method according to claim 1, 2, or 3, wherein said silicon body falls to a desired deposition temperature above said minimum temperature after said heat pulse to continue deposition.

8. A method according to claim 7, wherein said silicon carrier gas is silane and a remainder of said epitaxial silicon layer is deposited at a temperature between 650 degrees Celsius and 800 degrees Celsius.

9. A method according to claim 7, wherein said silicon carrier gas is trichlorsilane and a remainder of said epitaxial silicon layer is deposited at a temperature between 800 degrees Celsius and 850 degrees Celsius.

10. A method according to claim 1, 2, or 3, wherein said step of applying said heat pulse raises temperatures of said silicon body from said first temperature to said second temperature in less than about 20 seconds.

11. A method according to claim 1, 2, or 3, wherein said step of applying said heat pulse is carried out by a radiant heat source.

12. A method according to claim 11, wherein said second temperature ranges from 1000 degrees Celsius to 1250 degrees Celsius.

13. A method according to claim 12, wherein said step of passing said silicon carrier gas is carried out after said surfaces of said silicon body is cleaned.

14. A method according to claim 1, 2, or 3, wherein said step of reducing temperature below said minimum temperature occurs nearly immediately after said heat pulse ends.

15. A method according to claim 1, 2, or 3, wherein said heat pulse heats said silicon body to said second temperature in less than 20 seconds upon said step of applying said heat pulse.

16. A method according to claim 1, 2, or 3, wherein surfaces of said said silicon body are initially cleaned after applying said heat pulse, then said stream of hydrogen gas is ended, and finally said silicon carrier gas is passed over said silicon body during remaining portions of said heat pulse.

17. A method according to claim 16, wherein said heat pulse cleans said surfaces at said second temperature for a time ranging from 15 to 90 seconds.

* * * * *